United States Patent [19]

Zernov

[11] Patent Number: 4,985,808

[45] Date of Patent: Jan. 15, 1991

[54] PRINTED CIRCUIT BOARD SWITCHING SYSTEM FOR RESISTOR NETWORK

[75] Inventor: Jeffrey P. Zernov, Baxter, Minn.

[73] Assignee: Communications Systems, Inc., Hector, Minn.

[21] Appl. No.: 266,140

[22] Filed: Nov. 2, 1988

[51] Int. Cl.⁵ .............................................. H01R 9/09
[52] U.S. Cl. .................................. 361/406; 338/334; 379/398; 361/397
[58] Field of Search ................... 29/413; 248/DIG. 9; 338/195, 332, 334, 128, 137, 138; 361/397, 398, 406, 412, 417, 419, 420; 379/398, 400

[56] References Cited

U.S. PATENT DOCUMENTS

| | | | |
|---|---|---|---|
| 4,016,463 | 4/1977 | Beall et al. | 361/397 |
| 4,216,523 | 8/1980 | Harford | 361/413 |
| 4,227,238 | 10/1980 | Saito | 361/398 |

FOREIGN PATENT DOCUMENTS

| | | | |
|---|---|---|---|
| 2347442 | 4/1974 | Fed. Rep. of Germany | 361/412 |
| 0938327 | 10/1963 | United Kingdom | 361/412 |

Primary Examiner—Gregory D. Thompson
Attorney, Agent, or Firm—Kinney & Lange

[57] ABSTRACT

A printed circuit or printed wire board has a resistor network thereon, wired through conductors that are arranged so that individual circuit paths for different resistor combinations pass onto one of a plurality of peripheral tabs on the printed circuit board. The tabs are joined to the main portion of the circuit board through a frangible connection which permits breaking off the tabs. The main circuit into which the board is to be connected is tested to determine the needed circuit characteristics, and all but one of the tabs on the board are removed to provide the required circuit connections for matching the printed wire board circuit to the main circuit. The breakaway tabs permit selecting a particular circuit impedance so that the board is matched to the main circuit in which it is connected. The board is primarily used for compensation of a communications network where the loop loss of a telephone system is set to the right value.

8 Claims, 2 Drawing Sheets

PRINTED CIRCUIT BOARD SWITCHING SYSTEM FOR RESISTOR NETWORK

BACKGROUND OF THE INVENTION

1. Field of the Invention.

The present invention relates to a compensation circuit used for providing a selected output impedance and which is mounted on a board having breakaway tabs so that selected tabs can be removed for quickly and accurately selecting circuit connections for adjusting an output value of the impedance.

2. Description of the Prior Art.

In the prior art, after testing communication loops for obtaining the proper loop loss, compensating for such loss has required making individual connections to the selected impedance. Manual connections are needed to obtain the correct output compensation impedance from a circuit board containing a variable impedance, such a multi-tap resistor.

SUMMARY OF THE INVENTION

A printed wire board or circuit board has an adjustable impedance thereon, the output impedance value of which can be quickly adjusted by providing a plurality of circuit conductors that pass onto a tab or portion of a PC board, across at least one breakaway or frangible line defined on the board. A portion of the board can be thus separated from the main part of the board to cause a severing or disconnection of the circuit conductors that pass across the breakaway line of the board.

In the form shown, the printed wire or printed circuit board has a plurality of edge tabs, each of which is joined to the main portion of the board through a breakaway line formed by a plurality of adjacent perforations. Conductors pass onto each of the edge tabs and back from the tab to the main portion of the board between the perforations at the breakaway line. Upon breaking off a tab, all of the conductors that pass across the breakaway line for that tab are severed and the circuit connections made thereby are disconnected.

In the form shown, there are nine such breakaway tabs on the board, to adapt the circuit for use with a communications network so that there is a known, standard loop loss compensation through the board that is connected into the communications circuit. A loop loss of 9 dB can be achieved as a maximum, and decreased in increments that are desired. As shown, each tab decreases the loop loss by one dB by adjusting the output resistance value of a multi-tap resistor between the input and output.

The printed wire or printed circuit board conductors can be formed in a known manner, through photo-etching techniques and using batch processing. The edge positioned breakaway tabs are individually defined, and the frangible connections or breakaway lines also can be easily defined for accommodating the passage of the conductors onto and off of the tab and yet permitting easy breaking away of the tabs by a service person or installer.

The impedance that is adjusted can be varied as desired, and could be capacitive, inductive, or resistive. If desired, the breakaway tabs can be used for selecting complete circuits for connection between an input and an output. Various types of circuits can be accommodated.

Since the preferred embodiment is used in connection with a communication network system, the terminal designations for such a communications network will be utilized in the specification, and the loop loss designation in decibels will also be utilized. It is understood however that this represents impedance differences, or resistance differences, as will be shown in a table of values.

Low cost, easy manufacture, ease of installation, and reliable changing of connections is achieved because a mere breakaway of a tab severs all of the conductors necessary for making the adjustment.

DETAILED DESCRIPTION OF THE PREFERRED EMBODIMENTS

Figure 1:
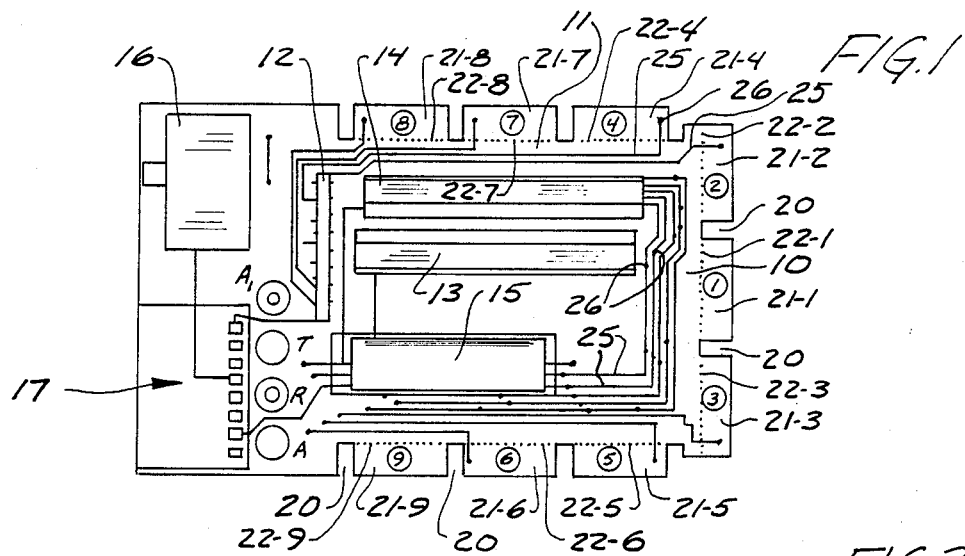
FIG. 1 is a top plan view of a typical circuit board utilizing the present invention for adjusting the impedance to output connections.

A circuit board indicated generally at 10 is made in a conventional manner and of suitable material, and carries a number of components, as well as conductors that are formed on the surface of the board. The board also can be called a printed wire board, with each of the individual wires or conductors being formed to connect to various components on the board and to output terminals. As shown, the board 10 has a main section 11 on which a first resistor group (U1) is indicated at 12, a second resistor group (U2) is indicated at 13, and a third resistor group or chain (U3) is indicated at 14. The board also includes a capacitor 15 (C1) and a switch 16. Suitable input and output terminals are indicated generally at 17, which are individually numbered in connection with the schematic representations of the present invention.

The board 10 is used in a communication network and provides for impedance level changes to provide the appropriate loop loss in a communications network. This is done by adjusting the value of the output by changing the effective value of resistors 12, 13, and 14 (U1, U2, and U3).

Figure 4:
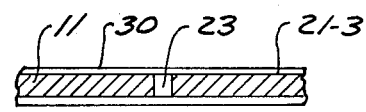
FIG. 4 is a fragmentary enlarged sectional view through a connection for breaking away a tab on the circuit board of FIG. 1.

The main portion 11 of the circuit board has a plurality of edge notches 20 defined therein which form a plurality of tabs that extend outwardly along three of the edges of the board. These tabs are indicated at 21-1; 21-2; 21-3; 21-4; 21-5; 21-6; 21-7; 21-8; and 21-9. Each of the tabs is joined to the main portion 11 of the board 10 through a frangible or breakaway connecting line 22-1 through 22-9. The frangible or breakaway line, as shown, comprises a plurality of holes 23 (See FIG. 4) that are drilled or otherwise formed through the board and which holes are connected by narrow spaces of circuit board material to form a perforated connection line that will be termed a breakaway line or frangible line. The frangible lines 22-1 through 22-9 as shown align with the inner end surface of the slots 20, so that the tabs 21 can be broken away from the main portion 11 of the board 10 by bending the tabs with a plier, or even manually.

The circuit board 10 has a plurality of individual conductors thereon, and these conductors are metal paths formed in a normal manner on the surfaces of the circuit board. On the top surface of the circuit board shown in FIG. 1, there are conductors 25 shown typically, and the conductors pass onto and are placed on selected ones of the tabs 21. The conductors are on the surface of the board between the individual apertures 23 for the frangible line 22-1 through 22-9 so that the conductors can pass onto the surface of the tab and span the frangible connecting lines 22-1 through 22-9 for the desired tabs. As shown, the conductors on one side of the board 10 can be connected to the back side of the board 10 (partially shown in FIG. 5) utilizing through plated openings 26A, in a conventional manner so the desired connections to the various conductors and components can be made.

Figure 2:
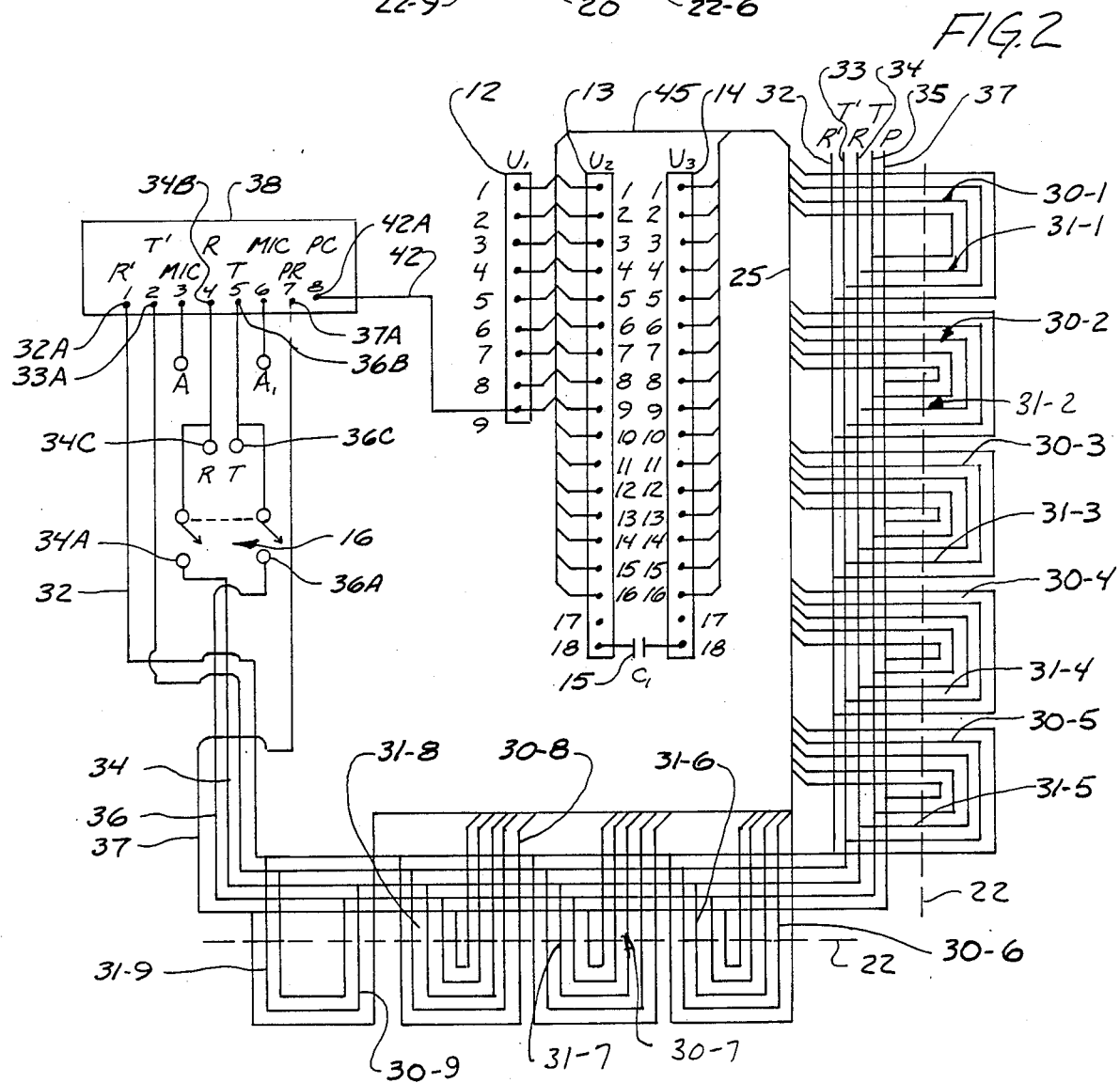
FIG. 2 is a schematic representation of the impedance circuit connections from the board of FIG. 1.
Figure 5:
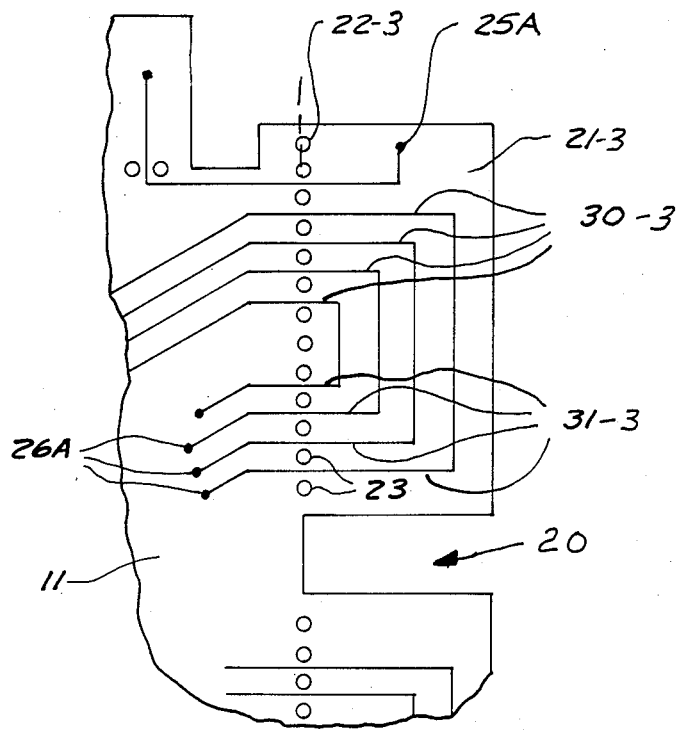
FIG. 5 is an enlarged plan view of a tab of the circuit board shown in FIG. 1 showing the breakaway connecting line between a tab and the main portion of a board.

The back surface of the board 10 also has a plurality of conductors thereon as can be seen fragmentarily and typically in FIG. 5 where the tab 21-3 is shown. As shown typically in FIG. 5 there are conductors 30-3 (four such conductors) that come from the resistors U1, U2, and U3 and individual terminals on such resistors and which then form a loop on the tab 21-3 and the conductors have sections 31-3 which pass between the individual openings 23 forming the frangible line 22-3. The conductor sections 31 that pass back onto the printed circuit board main portion 11 are connected through plated openings 26A (which are represented as terminals) to connect to bus or main conductors on the top surface of the board, which are shown in FIGS. 1 and 2. The buses comprise an R' line 32, a T' line 33, a ring line (R) 34, a tip line (T) 36, and a P (program resistor) line 37. The P line 37 leads to a terminal PR indicated at 37A in FIG. 2, and each of the other lines lead to suitable terminals as labeled in FIG. 2. The line 32 leads to the R terminal 32A; line 33 (T') connects to terminal T' on the terminal board 38, as shown at 33A. The bus or line 34 (R) is connected through one terminal of switch 16 to the R terminal on a terminal board 38. The R terminal for the switch 16 is indicated at 34A, and at 34B on board 38. Terminal board 38 is an eight position keyed jack in actual use. The T line 36 is connected through the T terminal of switch 16 indicated at 36A to the T terminal 36B on the terminal board 38. As previously indicated, the P line 37 is connected to the PR terminal 37A.

An input line indicated generally at 42 is connected to the PC terminal 42A on terminal board 38, and is the line connected to the U1 resistor 12.

In FIG. 2, the terminals for the multi tap or multi terminal resistors 12, 13, and 14 are numbered for identification purposes, and it can be seen that at the output of the resistors there are individual lines from each terminal shown as a bundle 45 leading to the first set of individual conductors 30-1 through 30-9 which are the typical conductors on each of the tabs 21-1 through 21-9. For identification purposes, in FIG. 2, the bundle of lines 45 is shown connected to the conductors 30-1 through 30-9 for each of the tabs, and also for convenience in designation in FIG. 1, the schematic position of the tab 21-1 is shown at the top right-hand corner of FIG. 2 and the tabs are shown sequentially down to the tab 21-9 which is shown at the lower left-hand corner. Each of the first conductor sets 30-1 through 30-9 and second conductor sets 31-1 through 31-9 (on tabs 21-1 through 21-9 respectively) pass across the break lines 22-1 through 22-9 for each of the tabs. The conductor sets 30-1 and 31-1 are called input and output connections for convenience, but the connections are through the resistor circuits for changing the impedance between the input and output tip terminals (T and T') and ring terminals (R and R') which are screw terminals 36C and 33A and 34C and 32A. The terminals 34C and 36C are connected to switch 16 and through the switch to the terminals 34A and 36A. The terminals 34B and 36B on the terminal board 38 are also connected to terminals 34C and 36C. Terminals 34C and 36C are then connected through the resistor sets U2 and U3 to the T' and R' terminals 33A and 32A, as shown in FIG. 2 to obtain the proper loop loss. The T' and R' terminals (33A and 32A) can be considered output terminals.

The lines 37 and 42 have the programming resistor therein which is represented by U1 (resistor 12) and changes in resistor 12 changes the resistance between the terminal 42A and the terminal 37A as different tabs are removed to sever the conductors on all but one of tabs 21-1 through 21-9 to provide for the proper impedance in the circuit. It should also be noted that terminals A and A1, which are labeled in FIGS. 1 and 2, can be provided for connecting auxiliary equipment.

The loop impedance of the external network can be determined by obtaining a signal from a central office through the connection lines, which is at a reference level that permits measurement of the loop loss. This provides an indication of the resistance values that are needed from board 10. A test set will read the loop loss directly in decibels. If the loop loss is a fraction of a decibel, and not a whole number, the fraction is raised to the next whole number. For example, if the numerical test reading indicates that a 6dB loop loss should be present, tab number 6 (21-6) would be left in place and all of the rest of the tabs 21-1 through 21-5 and 21-7 through 21-9 would be broken off.

In other words, the conductors are broken at all of the tabs except the one left. This leaves one set of conductors for connections across resistor segments between the input tip and ring lines, and the output tip and ring lines, namely between lines 36 and 37 and lines 32 and 33 and between the programming resistor connection.

Figure 3:
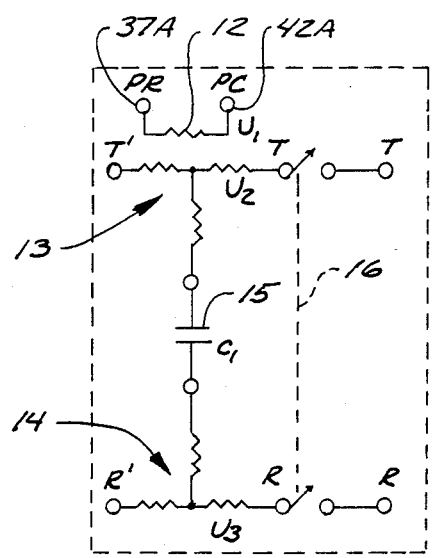
FIG. 3 is a overall circuit schematic representation for the impedance circuit of the board of FIG. 1.

The following tables show the individual connections for each of the tabs 21-1 through 21-9, and the number designation is the same as that on the individual lines, that is R' is line 32, T' is line 33, R is line 34, T is line 36, and for the programming resistor connects between lines PC and PR. The line 37 (P) forms a connection between terminals PC and PR. Further, it can be seen from FIG. 3 that the overall connections between terminals T and R through switch 16 includes connecting capacitor C1 (15) across the resistors formed by resistors 13 and 14 (U2 and U3 respectively). Also in Table I that follows, U1 is as designated on the drawings and this is the programming resistor 12. The resistor terminals for each of resistors U1, U2 and U3 are numbered on FIG. 2 and the terminal number follows the letter designation of the resistor, for example U3-1 is a connector at terminal 1 of resistor U3, which also carries the numeral 14.

A table of connections for each of the tabs is as follows:

TABLE I

CONNECTIONS

| Resistor and Terminal | Tab Conductors | Line |
|---|---|---|
| Tab 21-1 | | |
| U3-1 | To | R' (32) |
| U2-1 | To | T' (33) |
| U3-2 | To | R (34) |
| U2-2 | To | T (36) |
| Tab 21-2 | | |
| U3-3 | To | R' |
| U2-2 | To | T' |
| U3-4 | To | R |
| U2-4 | To | T |
| U1-1 | To | P |
| Tab 21-3 | | |
| U3-5 | To | R' |
| U2-5 | To | T' |
| U3-6 | To | R |
| U2-6 | To | T |
| U1-2 | To | P |
| Tab 21-4 | | |
| U3-7 | To | R' |
| U2-7 | To | T' |
| U3-8 | To | R |
| U2-8 | To | T |
| U1-3 | To | P |
| Tab 21-5 | | |
| U3-9 | To | R' |
| U2-9 | To | T' |
| U3-10 | To | R |
| U2-10 | To | T |
| U1-4 | To | P |
| Tab 21-6 | | |
| U3-11 | To | R' |
| U2-11 | To | T' |
| U3-12 | To | R |
| U2-12 | To | T |
| U1-5 | To | P |
| Tab 21-7 | | |
| U3-13 | To | R' |
| U2-13 | To | T' |
| U3-14 | To | R |
| U2-14 | To | T |
| U1-6 | To | P |
| Tab 21-8 | | |
| U3-15 | To | R' |
| U2-15 | To | T' |
| U3-16 | To | R |
| U2-16 | To | T |
| U1-7 | To | P |
| Tab 21-9 | | |
| U1-8 | To | P |
| (Line Connections on Tab 21-9)) | | |
| R' | To | R |
| T' | To | T |

For illustration the programming resistor (U1) values, obtained in a typical situation are shown on Table II when the single indicated tab is left in place on the main board 11. In other words, in Table II below, there is an infinite resistance when the tab No. 1 is left in place (U1 is not connected in on tab 21-1), decreasing to 866 Ohms when tab No. 9 is the only tab left in place.

The values of the other resistors are varied in the same manner.

TABLE II

RESISTOR VALUES IN LOOP

| Programming Resistor Value (Ohms) | Loop Loss in dB | Remaining Tab |
|---|---|---|
| Infinite | 0.1–1.0 | 21-1 |
| 19800 | 1.1–2.0 | 21-2 |
| 9200 | 2.1–3.0 | 21-3 |
| 5490 | 3.1–4.0 | 21-4 |
| 3610 | 4.1–5.0 | 21-5 |
| 2520 | 5.1–6.0 | 21-6 |
| 1780 | 6.1–7.0 | 21-7 |
| 1240 | 7.1–8.0 | 21-8 |
| 866 | 8.1–9.0 | 21-9 |

It can thus be seen that by physically breaking off all tabs but one tab from the board main portion 11, the conductors of circuit wires that are on the printed wire board are broken so that only the selected connections remain to provide for a change in impedance between input terminals and output terminals, wherein the input and output terminals are connected through a component that has selectable values at each of a plurality of terminals on the component. The board is easy to use and make and eliminates time consuming manual field connections.

Although the present invention has been described with reference to preferred embodiments, workers skilled in the art will recognize that changes may be made in form and detail without departing form the spirit and scope of the invention.

What is claimed is:

1. A printed wire board comprising a board member with conductors thereon, means defining a plurality of tabs extending from said board member adjacent at least one edge thereof, each of said tabs being joined to the board member through a break-line connection comprising intermittent openings and board portions between the opening extending along a breakaway line for each of the tabs, a plurality of tab conductors on each of said tabs, said tab conductors being joined to the board member conductors at different locations and each of said tab conductors spanning a respective breakaway line connection, whereby when a tab is permanently removed along the breakaway lines, the tab conductors spanning a respective breakaway line are broken.

2. The printed wire board of claim 1 wherein circuit components on the board member are electrically joined in a desired manner by the portions of the tab conductors on each of the tabs.

3. The printed wire board of claim 2 wherein said circuit components comprise resistors having different resistances connectable by terminals for programming of a first circuit located on the board member to a second circuit electrically connected to the first circuit, and individual conductors connected between each of said terminals and selected conductors on the board member, so that the tab conductors from the resistors pass across the break line on each respective tab.

4. A programmable circuit board comprising a board member having a plurality of conductors on at least one surface thereof, means defining a plurality of portions of the board member that are separable from a first portion of the board member, said means defining frangible line connections between the plurality of portions and the first portion, at least some of the conductors on the board member extending across the frangible line connections, whereby when one portion from the plurality is permanently broken off along the respective frangible line, the conductors crossing such frangible line are severed.

5. The circuit board of claim 4 and circuit components mounted to terminals located on the board member, the components interconnected with conductors between the terminals, the conductors crossing the frangible line connections.

6. The circuit board of claim 5 wherein the circuit components mounted to the board form an input/output electrical circuit.

7. A printed circuit board comprising:
a board member comprising:
   a first portion with components and conductors between the components comprising an input/output electrical circuit;
   a plurality of separable portions with frangible break line connections between the first portion and each separable portion, each break line connection comprising intermittent openings and board member portions between the openings extending along the break line;
   a plurality of conductors extending across each break line, the conductors electrically connecting components of the input/output circuit, whereby permanent removal of a separable portion along a respective break line severs the respective conductors and electrically disconnects components of the input/output circuit.

8. The printed circuit board of claim 7 wherein removal of a separable portion disconnects resistive, capacitive or inductive components of the input/output circuit.

* * * * *

UNITED STATES PATENT AND TRADEMARK OFFICE
CERTIFICATE OF CORRECTION

PATENT NO. : 4,985,808

DATED : January 15, 1991

INVENTOR(S) : Jeffrey P. Zernov

It is certified that error appears in the above-identified patent and that said Letters Patent is hereby corrected as shown below:

Col. 6, line 36, delete "opening", insert --openings--.

Signed and Sealed this

Twenty-first Day of May, 1991

*Attest:*

HARRY F. MANBECK, JR.

*Attesting Officer*  *Commissioner of Patents and Trademarks*